(12) United States Patent
Kim et al.

(10) Patent No.: US 9,432,028 B2
(45) Date of Patent: Aug. 30, 2016

(54) CLOCK DATA RECOVERY CIRCUIT AND A METHOD OF OPERATING THE SAME

(71) Applicant: SAMSUNG ELECTRONICS CO., LTD., Gyeonggi-do (KR)

(72) Inventors: Tae Jin Kim, Seoul (KR); Chang Hoon Baek, Gyeonggi-do (KR); Sang Kyu Lee, Gyeonggi-do (KR); Jae Youl Lee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/716,106

(22) Filed: May 19, 2015

(65) Prior Publication Data

US 2015/0358024 A1 Dec. 10, 2015

(30) Foreign Application Priority Data

Jun. 9, 2014 (KR) ........................ 10-2014-0069560

(51) Int. Cl.
| | |
|---|---|
| H03D 3/24 | (2006.01) |
| H03L 7/08 | (2006.01) |
| H03L 7/089 | (2006.01) |
| H03L 7/093 | (2006.01) |
| H03L 7/091 | (2006.01) |
| H03L 7/099 | (2006.01) |
| H03L 7/187 | (2006.01) |

(52) U.S. Cl.
CPC ............ H03L 7/0807 (2013.01); H03L 7/089 (2013.01); H03L 7/091 (2013.01); H03L 7/093 (2013.01); H03L 7/0992 (2013.01); H03L 7/0995 (2013.01); H03L 7/187 (2013.01)

(58) Field of Classification Search
CPC ... H03L 7/093; H03L 7/0891; H03L 7/0095; H03L 7/089; H03L 7/091; H03L 7/0992; H03L 7/0893; H03L 7/148; H03L 7/18; Y10S 331/02
USPC ........ 375/374, 376, 373, 375; 327/156, 157, 327/147, 148; 331/1 A
See application file for complete search history.

(56) References Cited

U.S. PATENT DOCUMENTS

| | | | |
|---|---|---|---|
| 7,127,022 | B1 | 10/2006 | Dieguez |
| 7,656,323 | B2 | 2/2010 | Bereza et al. |
| 7,772,900 | B2 | 8/2010 | Ainspan et al. |
| 8,331,514 | B2 | 12/2012 | Fu et al. |

(Continued)

FOREIGN PATENT DOCUMENTS

| | | |
|---|---|---|
| KR | 1020040110209 | 12/2004 |
| KR | 1020110114138 | 10/2011 |

*Primary Examiner* — Leila Malek
(74) *Attorney, Agent, or Firm* — F. Chau & Associates, LLC

(57) ABSTRACT

A clock data recovery circuit including: a digital phase detector and deserializer configured to sample serial data using a recovery clock signal to generate an up phase error signal and a down phase error signal which correspond to a phase difference between the serial data and the recovery clock signal; a digital loop filter configured to generate an up fine code and a down fine code based on a result of counting the up and down phase error signals; a loop combiner configured to generate an up fine tuning code and a down fine tuning code by using the up and down phase error signals and the up and down fine codes; and a digitally controlled oscillator configured to generate the recovery clock signal having a frequency changed with the up and down fine tuning codes.

19 Claims, 10 Drawing Sheets

(56) References Cited

U.S. PATENT DOCUMENTS

| | | |
|---|---|---|
| 8,334,725 B2 | 12/2012 | Wang et al. |
| 8,498,368 B1 * | 7/2013 | Husted ................. H03G 3/3052 |
| | | 375/316 |
| 2008/0253492 A1 * | 10/2008 | Wang ................... H03K 3/0315 |
| | | 375/376 |
| 2011/0022890 A1 | 1/2011 | Jeong et al. |
| 2011/0057738 A1 * | 3/2011 | Titus ....................... H03L 7/099 |
| | | 331/1 A |
| 2011/0194659 A1 * | 8/2011 | Kenney ................. H03L 7/0807 |
| | | 375/355 |
| 2011/0267122 A1 * | 11/2011 | Jeong .................... H03L 7/0807 |
| | | 327/165 |
| 2012/0161834 A1 | 6/2012 | Lee et al. |
| 2012/0257693 A1 | 10/2012 | Sindalovsky et al. |
| 2013/0070835 A1 | 3/2013 | Sindalovsky et al. |
| 2013/0234800 A1 * | 9/2013 | Lee .......................... H03L 7/06 |
| | | 331/1 A |

\* cited by examiner

CLOCK DATA RECOVERY CIRCUIT AND A METHOD OF OPERATING THE SAME

CROSS-REFERENCE TO RELATED APPLICATION

This application claims priority under 35 U.S.C. §119(a) to Korean Patent Application No. 10-2014-0069560 filed on Jun. 9, 2014, the disclosure of which is incorporated by reference herein in its entirety.

TECHNICAL FIELD

Exemplary embodiments of the inventive concept relate to a clock data recovery circuit and a method of operating the same.

DISCUSSION OF RELATED ART

In electronic systems using complementary metal-oxide semiconductor (CMOS) integrated circuit (IC) technology, communication between chips may require fast speed and wide bandwidth. Accordingly, each of the communicating chips may include a high-speed input/output (I/O) interface circuit such as a serial link.

In serial link communication, a clock signal for a party receiving data through a communication channel may not be separately provided. Accordingly, the receiving party may include a clock data recovery circuit which extracts clock information and data information from serial data to process the serial data at, for example, a rate of several gigabits per second.

A charge pump phase-locked loop (CPPLL) circuit has been used as a clock data recovery circuit. Recently, however, a digital clock data recovery circuit using CMOS IC technology has been used.

SUMMARY

An exemplary embodiment of the inventive concept provides a clock data recovery circuit for minimizing jitter and a method of operating the same.

An exemplary embodiment of the inventive concept provides a clock data recovery circuit for maintaining a proportional path gain constant even if there is a change in processes and a method of operating the same.

According to an exemplary embodiment of the inventive concept, there is provided a clock data recovery circuit including a digital phase detector and deserializer configured to sample serial data using a recovery clock signal to generate an up phase error signal and a down phase error signal which correspond to a phase difference between the serial data and the recovery clock signal, a digital loop filter configured to generate an up fine code and a down fine code based on a result of counting the up and down phase error signals, a loop combiner configured to generate an up fine tuning code and a down fine tuning code by using the up and down phase error signals and the up and down fine codes, and a digitally controlled oscillator configured to generate the recovery clock signal having a frequency changed with the up and down fine tuning codes.

The clock data recovery circuit may further include an automatic frequency control (AFC) unit configured to generate an AFC code which changes a frequency of the recovery clock signal; and an automatic process compensation (APC) unit configured to generate an APC code for regulating a frequency change per bit of the AFC code by controlling a source current.

The AFC unit may compare the frequency change of the AFC code with a frequency change of the up and down fine tuning codes and may compute a proportional path gain keeping the frequency change of the up and down fine tuning codes constant.

The digitally controlled oscillator may include a ring oscillator configured to generate the recovery clock signal; a source current generating unit configured to generate the source current according to the APC code, a copy current generating unit configured to generate a copy current which is supplied to the ring oscillator in units of the source current according to the AFC code, and a capacitance controlling unit connected to the ring oscillator and including load capacitors each having a capacitance varying with the up and down fine tuning codes.

The digital phase detector and deserializer may generate the up and down phase error signals after the frequency of the recovery clock signal is changed by the AFC code.

The digital loop filter may generate the up and down fine codes based on the result of the counting of the up and down phase error signals according to a frequency-divided clock signal resulting from dividing the frequency of the recovery clock signal by N. Here, N may be an integer and may be generated by the AFC unit.

The up fine code may include an integral up fine code and an additional up fine code resulting from adding a proportional path gain to the integral up fine code. The down fine code may include an integral down fine code and an additional down fine code resulting from subtracting the proportional path gain from the integral down fine code.

According to an exemplary embodiment of the inventive concept, there is provided a semiconductor device including an input/output interface including the above-described clock data recovery circuit and a data processing circuit configured to process the serial data based on the recovery clock signal.

According to an exemplary embodiment of the inventive concept, there is provided a method of operating a clock data recovery circuit. The method includes generating an APC code, which regulates a frequency change per bit of an AFC code; generating the AFC code which enables a frequency of a recovery clock signal to approach a target frequency; and performing a phase tracking to make a phase of the recovery clock signal approach a phase of serial data based on an up fine tuning code and a down fine tuning code.

The APC code may determine a source current for determining the frequency change per bit of the AFC code, and the method further includes comparing a frequency change of the AFC code with a frequency change of the up and down fine tuning codes and computing a proportional path gain keeping the frequency change of the up and down fine tuning codes constant.

The performing of the phase tracking may include detecting a phase difference between the serial data and the recovery clock signal and generating an up phase error signal and a down phase error signal, generating recovered data by sampling the serial data to form parallel data, generating an up phase error count signal and a down phase error count signal by counting the up and down phase error signals, generating an up fine code and a down fine code using an integral path gain and a proportional path gain based on a result of comparing the up phase error count signal with the down phase error count signal, generating an up fine tuning code and a down fine tuning code, which change the frequency and phase of the recovery clock signal, based on the up and down phase error signals and the up and down fine codes, and generating the recovery clock signal whose frequency and phase are controlled by the up and down fine tuning codes.

The generating of the up and down phase error signals may be performed after the AFC and APC codes are generated.

The generating of the up and down fine codes may include generating the up and down fine codes based on the result of the counting of the up and down phase error signals according to a frequency-divided clock signal resulting from dividing the frequency of the recovery clock signal by N, where N is an integer.

The generating of the up and down fine tuning codes may include generating the up and down fine tuning codes by using the up and down phase error signals and the up and down fine codes.

The up fine code may include an integral up fine code and an additional up fine code resulting from adding the proportional path gain to the integral up fine code and the down fine code may include an integral down fine code and an additional down fine code resulting from subtracting the proportional path gain from the integral down fine code.

According to an exemplary embodiment of the inventive concept, there is provided a clock data recovery circuit including: an APC circuit configured to generate an APC code; an AFC circuit configured to generate an AFC code, a proportional path gain and an integral path gain; a digital loop filter configured to generate up and down fine codes by using an up phase error count signal and a down phase error count signal according to the integral path gain and the proportional path gain; a loop combiner configured to generate up and down fine tuning codes based on up and down phase error signals and the up and down fine codes; and a digitally controlled oscillator configured to generate a recovery clock signal whose frequency is controlled by the APC code, the AFC code, and the up and down fine tuning codes.

The APC code may be generated by comparing the recovery clock signal to a reference clock signal.

The APC code may determine a source current which determines a unit of change of the AFC code.

The clock data recovery circuit may further include a digital phase detector and deserializer configured to generate the up and down phase error signals from serial data.

The AFC circuit may change the proportional path gain when there is a change in the up and down fine tuning codes.

BRIEF DESCRIPTION OF THE DRAWINGS

The above and other features of the inventive concept will become more apparent by describing in detail exemplary embodiments thereof with reference to the attached drawings in which.

DETAILED DESCRIPTION OF THE EMBODIMENTS

Figure 1:
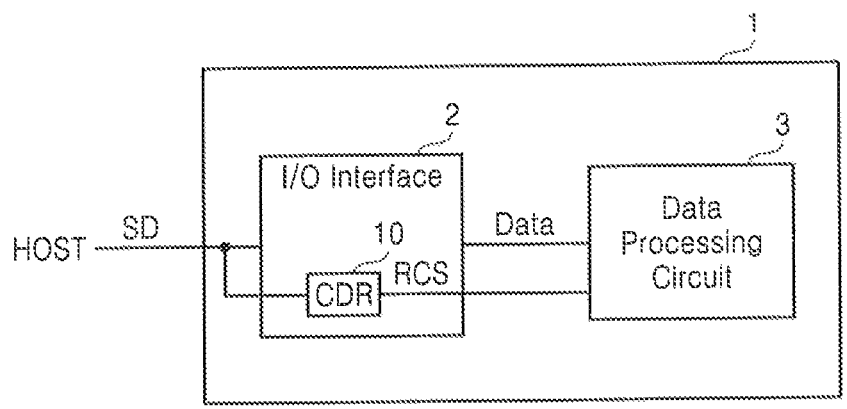
FIG. 1 is a block diagram of a semiconductor chip according to an exemplary embodiment of the inventive concept.

The inventive concept now will be described more fully hereinafter with reference to the accompanying drawings, in which exemplary embodiments thereof are shown. This inventive concept may, however, be embodied in many different forms and should not be construed as limited to the embodiments set forth herein. In the drawings, the size and relative sizes of layers and regions may be exaggerated for clarity. Like numbers may refer to like elements throughout the application.

It will be understood that when an element is referred to as being "connected" or "coupled" to another element, it can be directly connected or coupled to the other element or intervening elements may be present.

As used herein, the singular forms "a", "an" and "the" are intended to include the plural forms as well, unless the context clearly indicates otherwise.

FIG. 1 is a block diagram of a semiconductor chip 1 according to an exemplary embodiment of the inventive concept. The semiconductor chip 1 may be an electronic device which is formed in a chip such as an image sensor chip, an application processor, or a memory chip and communicates serial data SD with an external device such as a host. The semiconductor chip 1 may be implemented, on its own or together with a host, or as part of a laptop computer, a cellular phone, a smart phone, a tablet personal computer (PC), a mobile internet device (MID), a personal digital assistant (PDA), an enterprise digital assistant (EDA), a digital still camera, a digital video camera, a portable multimedia player (PMP), a personal navigation device or portable navigation device (PND), a handheld game console, or an e-book. The semiconductor chip 1 may include an input/output (I/O) interface 2 and a data processing circuit 3.

The I/O interface 2 may transmit serial data SD to and receive serial data SD from the host. The I/O interface 2 may not separately receive a clock signal, which is synchronized with the serial data SD, apart from the serial data SD. Accordingly, the I/O interface 2 may include a clock data recovery (CDR) circuit 10 that generates a recovery clock signal RCS synchronized with the serial data SD from the serial data SD.

The I/O interface 2 may transmit data Data resulting from processing the serial data SD and the recovery clock signal RCS to the data processing circuit 3. An example of the processing performed by the I/O interface 2 may include removing noise from the serial data SD. The data processing circuit 3 may use the data Data for operating the semiconductor chip 1 based on the recovery clock signal RCS synchronized with the data Data. The I/O interface 2 may transmit recovered data RDATA illustrated in FIG. 2 to the data processing circuit 3.

Figure 2:
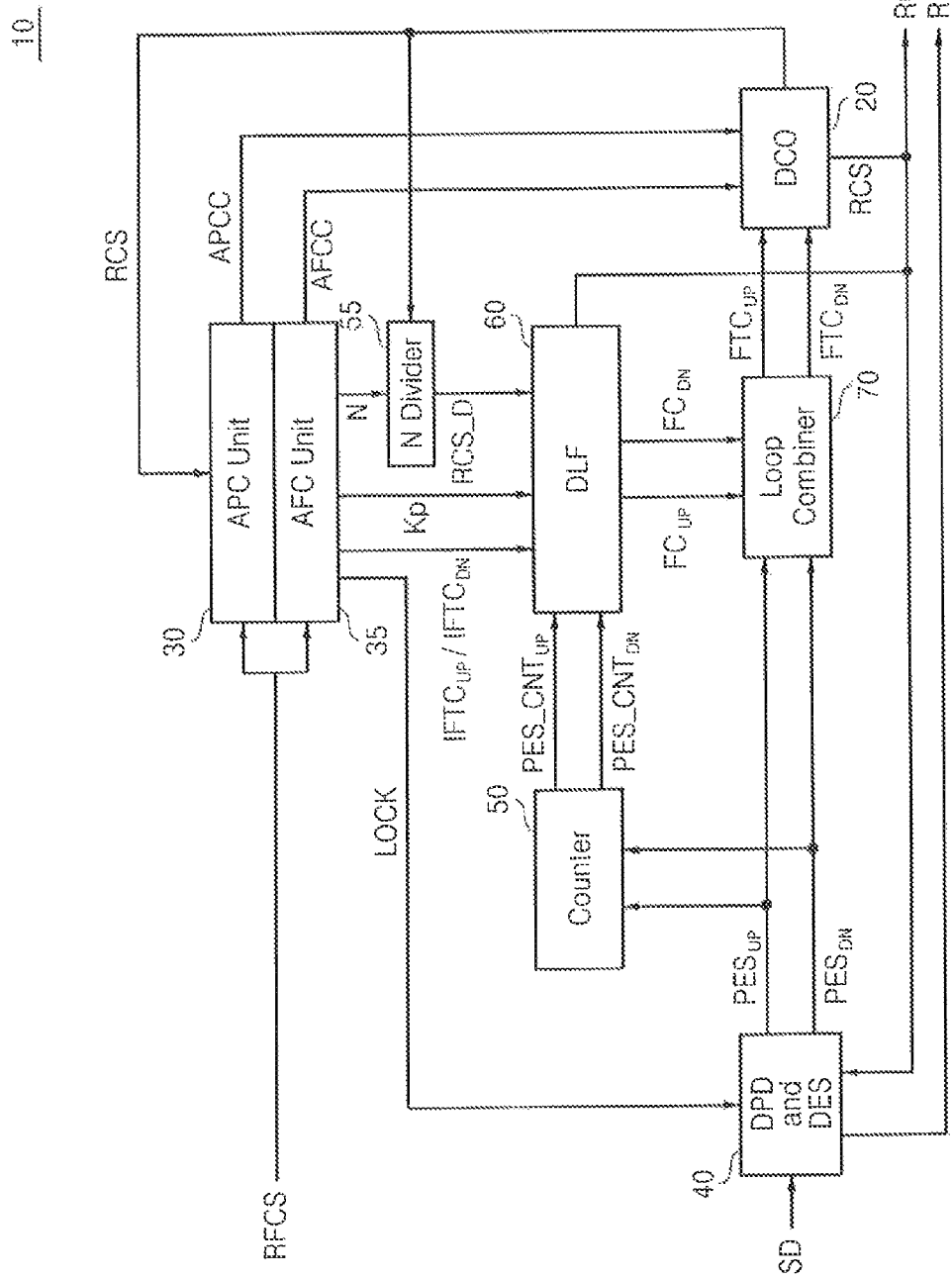
FIG. 2 is a block diagram of a clock data recovery circuit illustrated in FIG. 1, according an exemplary embodiment of the inventive concept.

FIG. 2 is a block diagram of the CDR circuit 10 illustrated in FIG. 1, according an exemplary embodiment of the inventive concept. Referring to FIGS. 1 and 2, the CDR circuit 10 may be implemented as an all-digital CDR (AD-CDR) circuit in which all operations are controlled digitally. The CDR circuit 10 may include a digitally controlled oscillator (DCO) 20, an automatic process compensation (APC) unit 30, an automatic frequency control (AFC) unit 35, a digital phase detector (DPD) and deserializer (DES) 40, a counter 50, an N-divider 55, a bang-bang digital loop filter (DLF) 60, and a loop combiner 70.

The DCO 20 may generate the recovery clock signal RCS whose frequency and/or phase is controlled by an APC code APCC, an AFC code AFCC, and up/down fine tuning codes $FTC_{UP}$ and $FTC_{DN}$, which will be described later.

The APC unit 30 may generate the APC code APCC for determining a source current ($I_S$ in FIG. 3) which determines a frequency variation per unit of the AFC code AFCC (e.g., that the AFC code AFCC increases or decreases by 1 when the AFC code AFCC is 6-bit data), which changes a frequency of the recovery clock signal RCS. In other words, the APC unit 30 compares the frequency of a reference clock signal RFCS with that of the recovery clock signal RCS and generates the APC code APCC so that the change per one bit of the AFC code AFCC (e.g., the product of a first proportional constant $\alpha_{PVT}$ and the source current $I_S$) is constant even if there is an external process, voltage and temperature (PVT) change. The reference clock signal RFCS is a signal with a target frequency. It may be generated by a clock generator provided within the semiconductor chip 1. The first proportional constant $\alpha_{PVT}$ indicates a frequency change per unit of source current $I_S$ and changes depending on PVT conditions.

The AFC unit 35 may compare the reference clock signal RFCS with the recovery clock signal RCS, determine the AFC code AFCC and initial up/down fine tuning codes $IFTC_{UP}$ and $IFTC_{DN}$, and control the DCO 20 to make the frequency of the recovery clock signal RCS close to the target frequency. When it is determined that the frequency of the recovery clock signal RCS is close to the target frequency (for example, the difference between the frequency of the recovery clock signal RCS and the target frequency is equal to or less than a threshold value), in other words, after acquisition of the frequency of the recovery clock signal RCS is completed, the AFC unit 35 may transmit a frequency lock signal LOCK to the DPD and DES 40. Close to the target frequency may also mean as close as possible or very close to the target frequency, for example.

The bang-bang DLF 60 receives the initial up/down fine tuning codes $IFTC_{UP}$ and $IFTC_{DN}$ from the AFC unit 35 and controls a phase tracking loop using the codes $IFTC_{UP}$ and $IFTC_{DN}$ as initial values. The initial up/down fine tuning codes $IFTC_{UP}$ and $IFTC_{DN}$ may be generated based on the difference between the frequency of the recovery clock signal RCS and the target frequency. The phase tracking loop may be a procedure for controlling the frequency and phase of the recovery clock signal RCS generated by the DCO 20 using the up and down fine tuning codes $FTC_{UP}$ and $FTC_{DN}$ after the frequency acquisition of the recovery clock signal RCS is completed.

The AFC unit 35 compares a frequency change of the AFC code AFCC during the frequency acquisition of the recovery clock signal RCS with a frequency change of the up/down fine tuning codes $FTC_{UP}$ and $FTC_{DN}$ and computes a target proportional path gain $K_P$. In other words, the AFC unit 35 changes the proportional path gain $K_P$, e.g., the number of bits, which varies with up/down phase error signals $PES_{UP}$ and $PES_{DN}$ of a proportional path, even when a frequency change per one bit of the up/down fine tuning codes $FTC_{UP}$ and $FTC_{DN}$ varies with a change in the PVT conditions. As a result, the AFC unit 35 controls the recovery clock signal RCS to have a target frequency changing per bit even if the PVT conditions change. In addition, the AFC unit 35 may determine an integral path gain N to adjust the resolution of up and down fine codes $FC_{UP}$ and $FC_{DN}$ corresponding to an integral path.

When receiving the frequency lock signal LOCK, the DPD and DES 40 may detect a phase difference between the serial data SD and the recovery clock signal RCS. The DPD and DES 40 may generate the up and down phase error signals $PES_{UP}$ and $PES_{DN}$ corresponding to the phase difference. In detail, the DPD and DES 40 may sample and compare an edge and a center of the serial data SD using the recovery clock signal RCS and may generate the up and down phase error signals $PES_{UP}$ and $PES_{DN}$. The DPD and DES 40 may generate the up phase error signal $PES_{UP}$ at a high level when the phase of the recovery clock signal RCS leads the phase of the serial data SD. The DPD and DES 40 may generate the down phase error signal $PES_{DN}$ at a high level when the phase of the recovery clock signal RCS lags behind the phase of the serial data SD. In addition, the DPD and DES 40 may sample the serial data SD to output the recovered data RDATA.

In an exemplary embodiment of the inventive concept, the DPD and DES 40 may send different kinds of the up phase error signal $PES_{UP}$ and the down phase error signal $PES_{DN}$ to the counter 50 and the loop combiner 70. For instance, the DPD and DES 40 may send the up and down phase error signals $PES_{UP}$ and $PES_{DN}$ with 2 UI to the counter 50 while sending the up and down phase error signals $PES_{UP}$ and $PES_{DN}$ with 1 UI to the loop combiner 70. Here, "UI" denotes a time unit of the period of the high level of the phase error signal. The period of the high level of the up and down phase error signals $PES_{UP}$ and $PES_{DN}$ sent to the counter 50 may be double the period of the high level of the up and down phase error signals $PES_{UP}$ and $PES_{DN}$ sent to the loop combiner 70.

The counter 50 may detect and count edges of the up and down phase error signals $PES_{UP}$ and $PES_{DN}$. The counter 50 may generate an up phase error count signal $PES\_CNT_{UP}$ corresponding to a result of counting the edges of the up phase error signal $PES_{UP}$ and a down phase error count signal $PES\_CNT_{DN}$ corresponding to a result of counting the edges of the down phase error signal $PES_{DN}$.

The N-divider 55 may receive the recovery clock signal RCS and may generate a frequency-divided clock signal RCS_D by dividing the frequency of the recovery clock signal RCS by N according to the integral path gain N generated by the AFC unit 35. Here, N may be an integer of at least 4, but the inventive concept is not restricted to this example.

The bang-bang DLF 60 may generate the up and down fine codes $FC_{UP}$ and $FC_{DN}$ based on the up phase error count signal $PES\_CNT_{UP}$ and the down phase error count signal $PES\_CNT_{DN}$ according to the integral path gain N and the proportional path gain $K_P$ determined by the AFC unit 35.

The loop combiner 70 may generate the up and down fine tuning codes $FTC_{UP}$ and $FTC_{DN}$, which change the frequency and phase of the recovery clock signal RCS, based on the up and down phase error signals $PES_{UP}$ and $PES_{DN}$ and the up and down fine codes $FC_{UP}$ and $FC_{DN}$. In other words, the loop combiner 70 may combine the up and down phase error signals $PES_{UP}$ and $PES_{DN}$ of a proportional path with the up and down fine codes $FC_{UP}$ and $FC_{DN}$ of an integral path, thereby generating the up and down fine tuning codes $FTC_{UP}$ and $FTC_{DN}$. That the frequency of the recovery clock signal RCS changes means that the up and down fine tuning codes $FTC_{UP}$ and $FTC_{DN}$ are changed due to the integral path. That the phase of the recovery clock signal RCS changes means that the frequency of the recovery clock signal RCS has been temporarily changed at a full rate due to the proportional path and has then returned to an original value.

Figure 3:
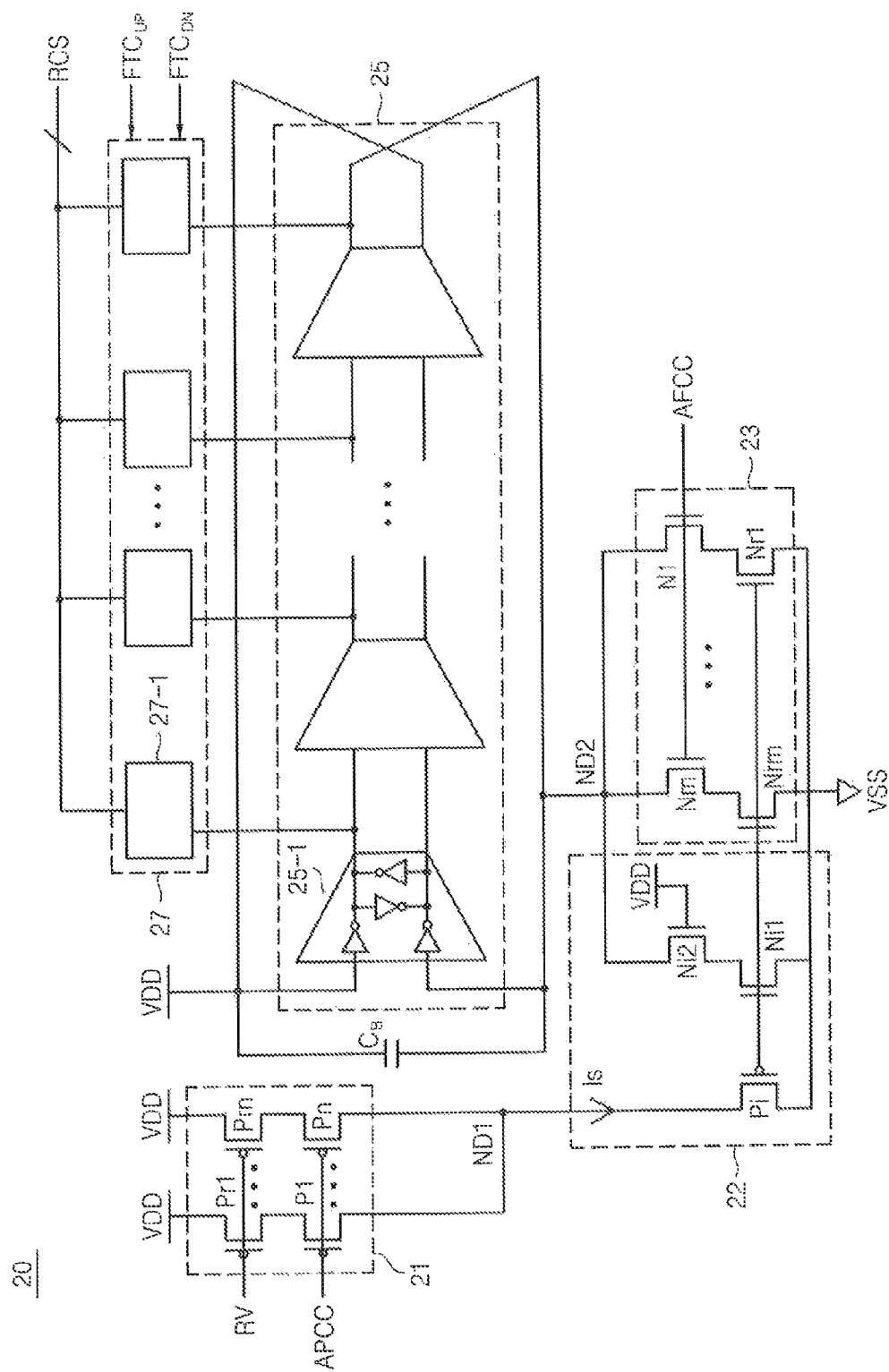
FIG. 3 is a block diagram of a digitally controlled oscillator (DCO) illustrated in FIG. 2, according an exemplary embodiment of the inventive concept.
Figure 4:
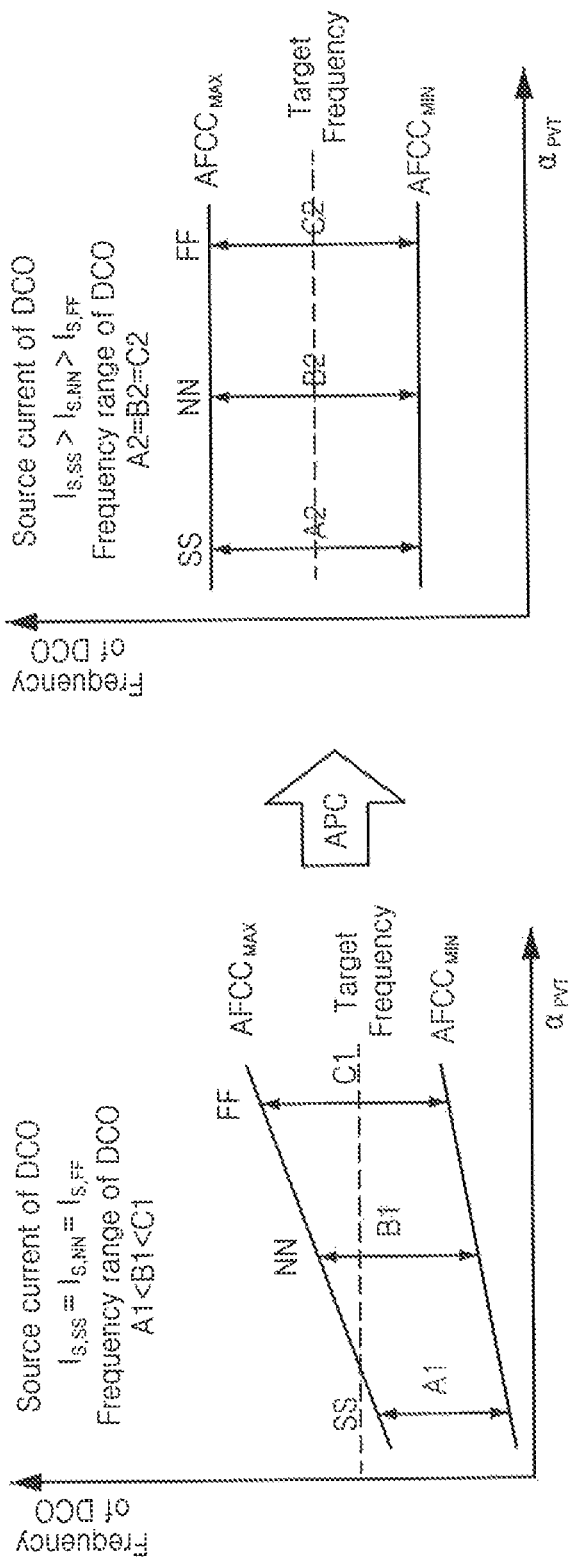
FIG. 4 is a diagram for explaining the operation of an automatic process compensation (APC) unit illustrated in FIG. 2, according an exemplary embodiment of the inventive concept.
Figure 5:
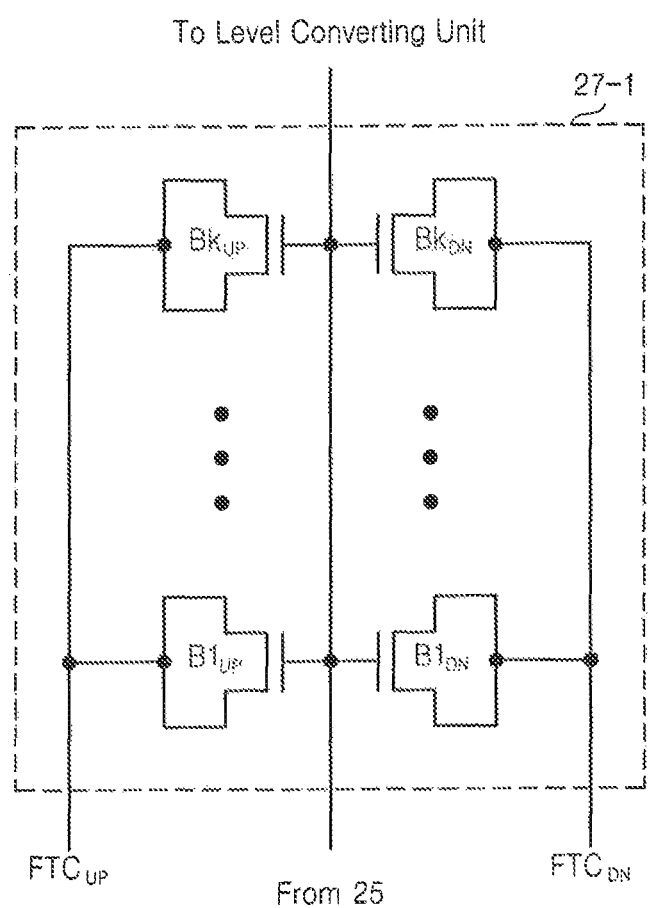
FIG. 5 is a block diagram of a capacitance control unit illustrated in FIG. 3, according an exemplary embodiment of the inventive concept.

FIG. 3 is a block diagram of the DCO 20 illustrated in FIG. 2, according to an exemplary embodiment of the inventive concept. FIG. 4 is a diagram for explaining the operation of the APC unit 30 illustrated in FIG. 2, according to an exemplary embodiment of the inventive concept. FIG. 5 is a block diagram of a sub fine tuning unit 27-1 illustrated in FIG. 3, according to an exemplary embodiment of the inventive concept. Referring to FIGS. 1 through 5, the DCO 20 may include a source current generating unit 21, a current mirror unit 22, a copy current generating unit 23, a ring oscillator 25, a capacitance control unit 27, and a level converting unit.

The source current generating unit 21 may include first through n-th P-channel metal oxide semiconductor (PMOS) transistors P1 through Pn and first through n-th current PMOS transistors Pr1 through Prn connected in parallel between a power supply voltage VDD and a first node ND1. The first through n-th PMOS transistors P1 through Pn may respectively receive "n" bits included in the APC code APCC. It is assumed that the first PMOS transistor P1 receives the least significant bit (LSB) of the APC code APCC, the n-th PMOS transistor Pn receives the most significant bit (MSB) of the APC code APCC, and the second through (n−1)-th PMOS transistors sequentially and respectively receive bits from a bit close to the LSB to a bit close to the MSB. The first through n-th current PMOS transistors Pr1 through Prn receive a bias voltage RV through their gates and generate a reference current. The bias voltage RV may have a level enabling all of the first through n-th current PMOS transistors Pr1 through Prn to be turned on and may be provided by a voltage generating circuit within the semiconductor chip 1. The first through n-th current PMOS transistors Pr1 through Prn may be different in size (e.g., a ratio of a channel width (W) to a channel length (L)) from one another. Accordingly, a current generated when the n-th PMOS transistor Pn receiving the MSB is turned on may be greater than that generated when the first PMOS transistor P1 receiving the LSB is turned on. The first through n-th PMOS transistors P1 through Pn may be turned on or off according to the APC code APCC to generate the source current $I_S$.

The current mirror unit 22 may include a current PMOS transistor Pi which allows the source current $I_S$ to flow, a first current N-channel MOS (NMOS) transistor Ni1 which is connected to a gate of the current PMOS transistor Pi to generate a current corresponding to the source current $I_S$ due to a mirroring effect, and a second current NMOS transistor Ni2.

The copy current generating unit 23 may include first through m-th replica NMOS transistors Nr1 through Nrm and first through m-th NMOS transistors N through Nm connected between a second node ND2 and a ground voltage VSS. The first through m-th replica NMOS transistors Nr1 through Nrm may be connected to a gate of the current PMOS transistor Pi to generate a current corresponding to the source current $I_S$ due to a mirroring effect. The first through m-th replica NMOS transistors Nr1 through Nrm may be different from one another in size. For instance, the first replica NMOS transistor Nr1 connected to the first NMOS transistor N1 may be the smallest in size and may generate the smallest current. The m-th replica NMOS transistor Nrm connected to the m-th NMOS transistor Nm may be the largest in size and may generate the greatest current.

The first through m-th NMOS transistors N1 through Nm may respectively receive "m" bits included in the AFC code AFCC. It is assumed that the first NMOS transistor N1 receives the LSB of the AFC code AFCC, the m-th NMOS transistor Nm receives the MSB of the AFC code AFCC, and the second through (m−1)-th NMOS transistors sequentially and respectively receive bits from a bit close to the LSB to a bit close to the MSB.

The first through m-th NMOS transistors N1 through Nm may be turned on or off according to the AFC code AFCC to supply a current corresponding to the AFC code AFCC to the ring oscillator 25. As the current supplied to the ring oscillator 25 increases, the frequency of the recovery clock signal RCS generated by the ring oscillator 25 may increase. In other words, the copy current generating unit 23 may generate a copy current, e.g., the current supplied to the ring oscillator 25 in units of the source current $I_S$ according to the AFC code AFCC.

The source current $I_S$ generated by the source current generating unit 21 may determine the current (e.g., the current flowing in the first NMOS transistor N1 receiving the LSB) that the copy current generating unit 23 supplies to the ring oscillator 25 per unit (e.g., LSB) of the AFC code AFCC. In other words, the APC code APCC generated by the APC unit 30 may determine the current supplied to the ring oscillator 25 per unit of the AFC code AFCC and the frequency of the recovery clock signal RCS may be determined depending on the variable current supplied to the ring oscillator 25.

A difference between the frequency of the recovery clock signal RCS generated by a current supplied to the ring oscillator 25 at a minimum value $AFCC_{MIN}$ (e.g., "000000" when m=6) of the AFC code AFCC and the frequency of the recovery clock signal RCS generated by a current supplied to the ring oscillator 25 at a maximum value AFCCMA (e.g., "111111" when m=6) of the AFC code AFCC may be defined as a frequency range.

FIG. 4 shows the frequency range at each of a plurality of process corners. A processor corner changes according to the operational characteristics of NMOS transistors and PMOS transistors included in the DCO 20. For example, the first proportional constant $\alpha_{PVT}$ depending on a PVT increases from a first corner SS to second and third corners NN and FF. The frequency of the recovery clock signal RCS, e.g., the frequency of the DCO 20 is proportional to the product of the first proportional constant $\alpha_{PVT}$ and the source current $I_S$. A slope at which the frequency of the DCO 20 increases from the first corner SS toward the third corner FF when the AFC code AFCC has the minimum value $AFCC_{MIN}$ is lower than a slope at which the frequency of the DCO 20 increases from the first corner SS toward the third corner FF when the AFC code AFCC has the maximum value $AFCC_{MAX}$.

Consequently, as shown in a graph on the left in FIG. 4, when the source current $I_S$ is the same at the first to third process corners SS, NN, and FF (e.g., $I_{S,SS}=I_{S,NN}=I_{S,FF}$), a frequency range A1 at the first corner SS is the narrowest and a frequency range C1 at the third corner FF is the widest. In an ideal condition, the target frequency is the median of each of the frequency ranges A1, B1, and C1 to enable coarse tuning using the AFC code AFCC to be appropriately performed. However, this ideal condition is not satisfied when the source current $I_S$ is the same at the first to third process corners SS, NN, and FF. Accordingly, as a process corner changes, the frequency of the recovery clock signal RCS may not be made approximate to the target frequency using the AFC code AFCC. Therefore, the recovery clock signal RCS may have a phase error.

As shown in a graph on the right in FIG. 4, when the source current $I_S$ is different among the first to third process corners SS, NN, and FF (e.g., $I_{S,SS} > I_{S,NN} > I_{S,FF}$), frequency ranges A2, B2, and C2 at the respective first through third corners SS, NN, and FF become the same, e.g., A2=B2=C2. In addition, the target frequency is the median of each of the frequency ranges A2, B2, and C2. It is to be understood that making the source current $I_S$ different at each of the first to third process corners SS, NN, and FF is just an example. The source current $I_S$ may be made different at any point among each of the first to third process corners SS, NN, and FF to keep the frequency range the same throughout all of the process ranges.

Since the frequency of the recovery clock signal RCS, e.g., the frequency of the DCO 20 is proportional to the product of the first proportional constant $\alpha_{PVT}$ and the source current $I_S$, the product of the first proportional constant $\alpha_{PVT}$ and the source current $I_S$ becomes constant when the source current $I_S$ is decreased from the first corner SS toward the third corner FF using the APC code APCC, in other words, when $I_{S,SS} > I_{S,NN} > I_{S,FF}$. Accordingly, the frequency range is constant at the first through third process corners SS, NN, and FF.

In addition, when the frequency of the recovery clock signal RCS, which is generated by a current supplied by the APC unit 30 to the ring oscillator 25 using the APC code APCC at the minimum value $AFCC_{MIN}$ of the AFC code AFCC (in other words, when the AFC unit 35 applies the minimum value of the AFC code AFCC to the DCO 20), is set to a predetermined percentage of the target frequency (e.g., 50% of the target frequency when a ratio of a current generated from the current NMOS transistor Ni1 to a current generated from the first through m-th replica NMOS transistors Nr1 through Nrm is 1:2); the target frequency corresponds to the median of the frequency range at each of the first through third corners SS, NN, and FF. Consequently, the CDR circuit 10 maintains a tunable frequency range constant regardless of PVT changes, thereby reducing phase errors.

Once the source current $I_S$ is determined by the APC unit 30, the AFC unit 35 changes the AFC code AFCC, for example, increases or decreases the AFC code AFCC by 1 to make the frequency of the recovery clock signal RCS approximate to the target frequency. The AFC unit 35 may determine the AFC code AFCC that allows the frequency of the recovery clock signal RCS to be closest to the target frequency and a current supplied to the ring oscillator 25 may be maintained constant.

Once the AFC code AFCC is determined, the up/down fine tuning codes $FTC_{UP}$ and $FTC_{DN}$ may be increased or decreased to be set to values allowing the frequency of the recovery clock signal RCS to be closest to the target frequency. The AFC unit 35 compares a frequency change per one bit of the AFC code AFCC with a frequency change per one bit of the up/down fine tuning codes $FTC_{UP}$ and $FTC_{DN}$ to determine the proportional path gain $K_P$. Since the frequency change per one bit of the AFC code A FCC is maintained constant regardless of PVT changes, even if a frequency is changed per one bit of the up/down fine tuning codes $FTC_{UP}$ and $FTC_{DN}$ according to PVT changes when the proportional path gain $K_P$ is constant, the proportional path gain $K_P$ is adjusted so that $\Delta FI*K_P$ is maintained constant. As a result, a frequency change FBB (=$\Delta FI*K_P$) per one bit of the up/down fine tuning codes $FTC_{UP}$ and $FTC_{DN}$ is controlled to be constant regardless of PVT changes. Here, $\Delta FI$ denotes a second proportional constant which indicates a frequency change per unit of the proportional path gain $K_P$ and depends on the PVT changes.

Therefore, the CDR circuit 10 maintains a frequency change per bit at a predetermined value in a phase tracking loop regardless of PVT changes, thereby reducing phase errors.

The ring oscillator 25 may include a plurality of delay cells 25-1 connected in a ring shape and a bypass capacitor $C_B$. For instance, when there are eight delay cells 25-1, the ring oscillator 25 may generate the recovery clock signal RCS with eight different phases. The bypass capacitor $C_B$ filters noise from high-frequency power supplied to the delay cells 25-1.

The capacitance control unit 27 may include a plurality of sub fine tuning units 27-1 respectively connected to outputs of the respective delay cells 25-1. The sub fine tuning units 27-1 may respectively pass the outputs of the delay cells 25-1. Each of the sub fine tuning units 27-1 includes load capacitors having an output capacitance varying with the up and down fine tuning codes $FTC_{UP}$ and $FTC_{DN}$ to change the frequency of the recovery clock signal RCS generated by the ring oscillator 25.

FIG. 5 shows one of the sub fine tuning units 27-1. A sub fine tuning unit 27-1 may include first through k-th up varactors $B1_{UP}$ through $Bk_{UP}$ and first through k-th down varactors $B1_{DN}$ through $Bk_{DN}$ connected to output lines of the respective delay cells 25-1.

Each of the first through k-th up varactors $B1_{UP}$ through $Bk_{UP}$ and the first through k-th down varactors $B1_{DN}$ through $Bk_{DN}$ has a structure in which a source and a drain are connected to each other and operates as a single load capacitor. In the varactors $B1_{UP}$ through $Bk_{UP}$ and $B1_{DN}$ through $Bk_{DN}$, capacitance varies with a voltage applied to the source and drain terminals. For instance, the capacitance decreases in the varactors $B1_{UP}$ through $Bk_{UP}$ and $B1_{DN}$ through $Bk_{DN}$ when a voltage at a high level is applied and the capacitance increases in the varactors $B1_{UP}$ through $Bk_{UP}$ and $B1_{DN}$ through $Bk_{DN}$ when a voltage at a low level is applied.

The first through k-th up varactors $B1_{UP}$ through $Bk_{UP}$ may respectively receive "k" bits included in the up fine tuning code $FTC_{UP}$. It is assumed that the first up varactor $B1_{UP}$ receives the LSB of the up fine tuning code $FTC_{UP}$, the k-th up varactor $Bk_{UP}$ receives the MSB of the up fine tuning code $FTC_{UP}$, and the second through (k−1)-th up varactors sequentially and respectively receive bits from a bit close to the LSB to a bit close to the MSB. The capacitance of each of the first through k-th up varactors $B1_{UP}$ through $Bk_{UP}$ decreases more in a higher-numbered up varactor when a high-level voltage is applied to the source and drain terminals. Accordingly, total capacitance of the first through k-th up varactors $B1_{UP}$ through $Bk_{UP}$ at a minimum value (e.g., "000000" when "k" is 6) of the up fine tuning code $FTC_{UP}$ sequentially decreases as the value of the up fine tuning code $FTC_{UP}$ increases toward a maximum value (e.g., "111111" when "k" is 6). As a result, the frequency of the recovery clock signal RCS output from the ring oscillator 25 sequentially increases.

The first through k-th down varactors $B1_{DN}$ through $Bk_{DN}$ may respectively receive "k" bits included in the down fine tuning code $FTC_{DN}$. It is assumed that the first down varactor $B1_{DN}$ receives the LSB of the down fine tuning code $FTC_{DN}$, the k-th down varactor $Bk_{DN}$ receives the MSB of the down fine tuning code $FTC_{DN}$, and the second through (k−1)-th down varactors sequentially and respectively receive bits from a bit close to the LSB to a bit close to the MSB. The capacitance of each of the first through k-th down varactors $B1_{DN}$ through $Bk_{DN}$ decreases more in a higher-numbered down varactor when a high-level voltage is applied to the source and drain terminals. Accordingly, total capacitance of the first through k-th down varactors $B1_{DN}$ through $Bk_{DN}$ at a minimum value (e.g., "000000" when "k" is 6) of the down fine tuning code $FTC_{DN}$ sequentially decreases as the value of the down fine tuning code $FTC_{DN}$ increases toward a maximum value (e.g., "111111" when "k" is 6). As a result, the frequency of the recovery clock signal RCS output from the ring oscillator 25 sequentially increases. However, a value of the down fine tuning code $FTC_{DN}$ decreases, since the DPD and DES 40 generates the down phase error signal $PES_{DN}$ at the high level. Accordingly, the more the down phase error signal $PES_{DN}$ at the high level is generated, the lower the down fine tuning code $FTC_{DN}$ becomes, so that the frequency of the recovery clock signal RCS sequentially decreases.

Figure 6:
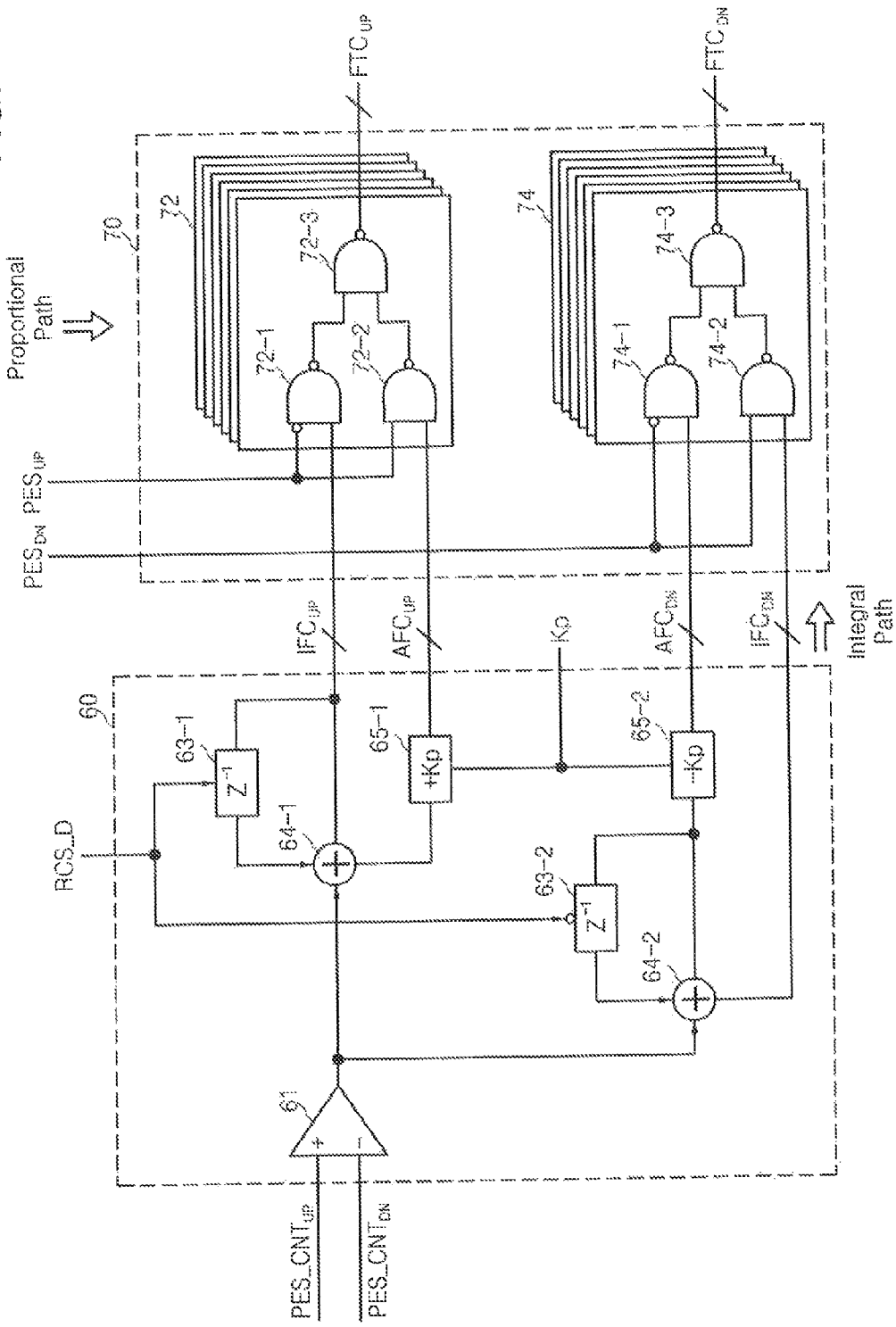
FIG. 6 is a diagram of a bang-bang digital loop filter (DLF) and a loop combiner illustrated in FIG. 2, according an exemplary embodiment of the inventive concept.

FIG. 6 is a diagram of the bang-bang DLF 60 and the loop combiner 70 illustrated in FIG. 2, according to an exemplary embodiment of the inventive concept. Referring to FIGS. 1 through 6, the bang-bang DLF 60 may include a comparator 61, first and second timing controllers 63-1 and 63-2, first and second adders 64-1 and 64-2, and first and second proportional path gain controllers 65-1 and 65-2.

The comparator 61 may compare the up phase error count signal $PES\_CNT_{UP}$ with the down phase error count signal $PES\_CNT_{DN}$ and output a comparison result. The comparator 61 may output a value of +1 when the up phase error count signal $PES\_CNT_{UP}$ is higher than the down phase error count signal $PES\_CNT_{DN}$, a value of −1 when the up phase error count signal $PES\_CNT_{UP}$ is lower than the down phase error count signal $PES\_CNT_{DN}$, and a value of 0 when the up phase error count signal $PES\_CNT_{UP}$ is equal to the down phase error count signal $PES\_CNT_{DN}$.

The first and second timing controllers 63-1 and 63-2 may determine the operating timing of the first and second adders 64-1 and 64-2, respectively. For example, the first timing controller 63-1 may operate at a rising edge of the frequency-divided clock signal RCS_D and the second timing controller 63-2 may operate at a falling edge of the frequency-divided clock signal RCS_D.

The first and second adders 64-1 and 64-2 may output the comparison result of the comparator 61 according to the control of the first and second timing controllers 63-1 and 63-2, respectively. The outputs of the first and second adders 64-1 and 64-2 may be the bases of the up and down fine codes $FC_{UP}$ and $FC_{DN}$ corresponding to the outputs of an integral path. The initial values of the outputs of the first and second adders 64-1 and 64-2 may be determined by the initial up/down fine tuning codes $IFTC_{UP}$ and $IFTC_{DN}$ generated by the AFC unit 35.

For example, the up fine code $FC_{UP}$ includes an integral up fine code $IFC_{UP}$ and an additional up fine code $AFC_{UP}$. The integral up fine code $IFC_{UP}$ is the comparison result output from the first adder 64-1 and the additional up fine code $AFC_{UP}$ is a result of adding the comparison result and the proportional path gain $K_P$. In other words, $AFC_{UP}=IFC_{UP}+K_P$.

The down fine code $FC_{DN}$ includes an integral down fine code $IFC_{DN}$ and an additional down fine code $AFC_{DN}$. The integral down fine code $IFC_{DN}$ is the comparison result output from the second adder 64-2 and the additional down fine code $AFC_{DN}$ is a result of subtracting the proportional path gain $K_P$ from the comparison result. In other words, $AFC_{DN}=IFC_{DN}-K_P$.

Accordingly, a value of N determines a division ratio for the recovery clock signal RCS and thus determines a period of the frequency-divided clock signal RCS_D, thereby determining the number of times the first and second adders 64-1 and 64-2 output the comparison result. This means that the value N is an integral path gain related with a degree to which the output of the integral path contributes to the up and down fine tuning codes $FTC_{UP}$ and $FTC_{DN}$. The degree to which the output of the integral path contributes to the up and down fine tuning codes $FTC_{UP}$ and $FTC_{DN}$ may be proportional to a division ratio of 1/N corresponding to a reciprocal of the integral path gain N.

The first proportional path gain controller 65-1 may generate the additional up fine code $AFC_{UP}$ by adding the proportional path gain $K_P$ to the comparison result and the second proportional path gain controller 65-2 may generate the additional down fine code $AFC_{DN}$ by subtracting the proportional path gain $K_P$ from the comparison result. The proportional path gain $K_P$ may determine a code value rising or falling in a period in which the up and down fine tuning codes $FTC_{UP}$ and $FTC_{DN}$ are at a high level. In other words, the proportional path gain $K_P$ indicates a degree to which the output of the proportional path contributes to the up and down fine tuning codes $FTC_{UP}$ and $FTC_{DN}$.

The loop combiner 70 may include a plurality of first logics 72 generating the up fine tuning code $FTC_{UP}$ and a plurality of second logics 74 generating the down fine tuning code $FTC_{DN}$. The number of the first logics 72 or the second logics 74 corresponds to the number of bits in any one among the integral up fine code $IFC_{UP}$, the additional up fine code $AFC_{UP}$, the integral down fine code $IFC_{DN}$, and the additional down fine code $AFC_{DN}$. In the exemplary embodiment illustrated in FIG. 6, the number of bits is 6.

Each of the first logics 72 may include a first NAND 72-1, a second NAND 72-2, and a third NAND 72-3. The first NAND 72-1 may receive an inverted signal of the up phase error signal $PES_{UP}$ and the integral up fine code $IFC_{UP}$ and the second NAND 72-2 may receive the up phase error signal $PES_{UP}$ and the additional up fine code $AFC_{UP}$. The third NAND 72-3 may receive the output of the first NAND 72-1 and the output of the second NAND 72-2 and may output the up fine tuning code $FTC_{UP}$.

Each of the second logics 74 may include a fourth NAND 74-1, a fifth NAND 74-2, and a sixth NAND 74-3. The fourth NAND 74-1 may receive an inverted signal of the down phase error signal $PES_{DN}$ and the additional down fine code $AFC_{DN}$ and the fifth NAND 74-2 may receive the down phase error signal $PES_{DN}$ and the integral down fine code $IFC_{DN}$. The sixth NAND 74-3 may receive the output of the fourth NAND 74-1 and the output of the fifth NAND 74-2 and may output the down fine tuning code $FTC_{DN}$.

The loop combiner 70 may combine an output of the proportional path corresponding to the up and down phase error signals $PES_{UP}$ and $PES_{DN}$ and an output of the integral path corresponding to the up and down fine codes $FC_{UP}$ and $FC_{DN}$ to generate a single code $FTC_{UP}$ or $FTC_{DN}$. Accordingly, a gain change occurring due to the change in operating voltage and temperature is the same between the proportional path and the integral path, and therefore, the loop stability of the CDR circuit 10 is not impacted by the change in operating voltage and temperature.

In addition, the up and down phase error signals $PES_{UP}$ and $PES_{DN}$ are transmitted through only two NANDs on the proportional path, so that a loop latency is decreased. This is because the proportional path gain $K_P$ is controlled by the additional up and down fine signals $AFC_{UP}$ and $AFC_{DN}$ of the bang-bang DLF 60. Since the integral path gain N is controlled, the resolution of the up and down fine codes $FC_{UP}$ and $FC_{DN}$ corresponding to the integral path is increased.

Figure 7:
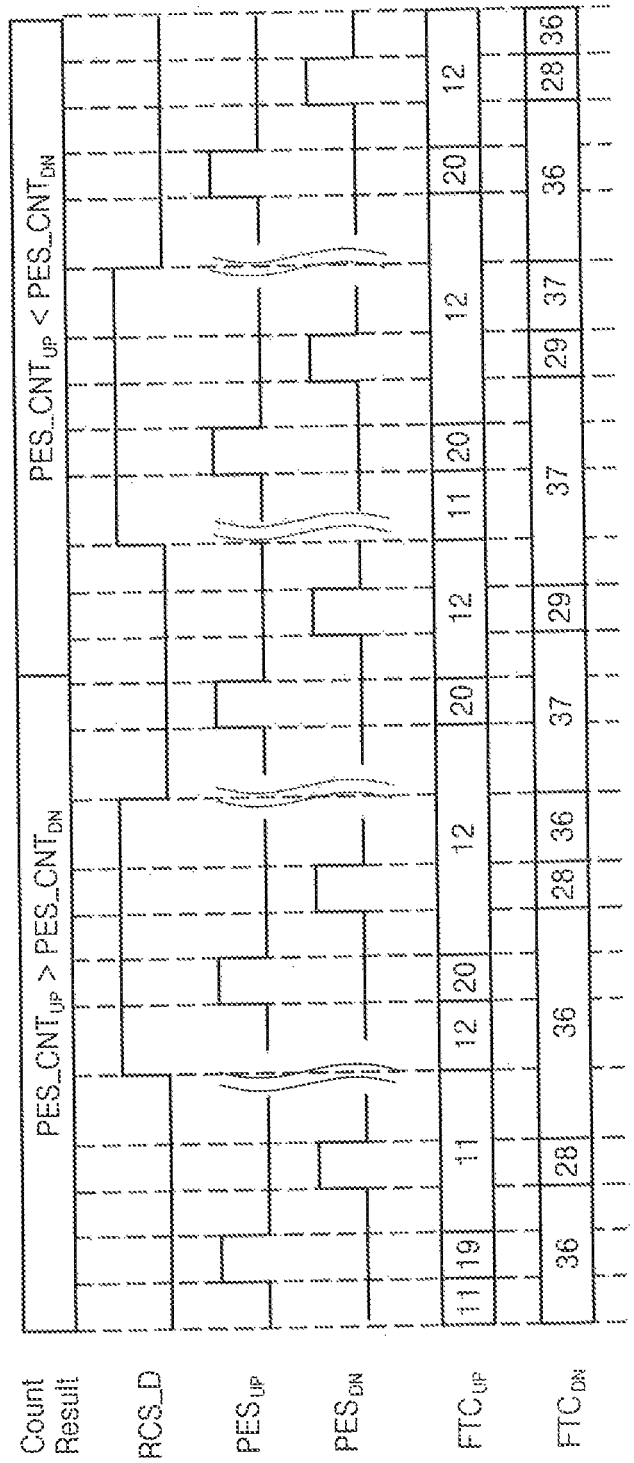
FIG. 7 is a diagram for explaining the operation of the clock data recovery circuit illustrated in FIG. 2, according an exemplary embodiment of the inventive concept.

FIG. 7 is a diagram for explaining the operation of the CDR circuit 10 illustrated in FIG. 2, according to an exemplary embodiment of the inventive concept. Referring to FIGS. 1 through 7, FIG. 7 shows the changes in the up and down fine tuning codes $FTC_{UP}$ and $FTC_{DN}$ with respect to other signals when the proportional path gain $K_P$ is 8 and the integral path gain N is 4.

During the high-level period of the up phase error signal $PES_{UP}$, the up fine tuning code $FTC_{UP}$ increases by the proportional path gain $K_P$, e.g., 8. For example, from 11 to 19. During the high-level period of the down phase error signal $PES_{DN}$, the down fine tuning code $FTC_{DN}$ decreases by the proportional path gain $K_P$, e.g., 8. For example, from 36 to 28.

During a period while the up phase error count signal $PES\_CNT_{UP}$ is greater than the down phase error count signal $PES\_CNT_{DN}$, the up fine tuning code $FTC_{UP}$ changes by +1 corresponding to the output of the comparator 61 at a rising edge of the frequency-divided clock signal RCS_D. For example, from 11 to 12. The down fine tuning code $FTC_{DN}$ also changes by the output of the comparator 61, e.g., +1 at a falling edge of the frequency-divided clock signal RCS_D. For example, from 36 to 37.

During a period while the up phase error count signal $PES\_CNT_{UP}$ is less than the down phase error count signal $PES\_CNT_{DN}$, the up fine tuning code $FTC_{UP}$ changes by −1 corresponding to the output of the comparator 61 at a rising edge of the frequency-divided clock signal RCS_D (e.g., from 12 to 11) and the down fine tuning code $FTC_{DN}$ also changes by the output of the comparator 61, e.g., −1 at a falling edge of the frequency-divided clock signal RCS_D (e.g., from 37 to 36).

Consequently, as the above-described procedure is repeated, a phase difference between the serial data SD and the recovery clock signal RCS is reduced.

Figure 8:
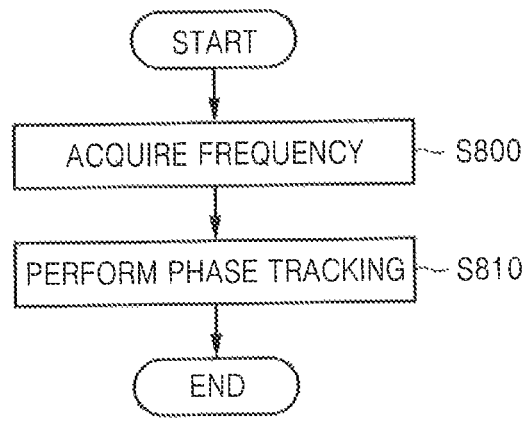
FIG. 8 is a flowchart of a method of operating the clock data recovery circuit illustrated in FIG. 2 according to an exemplary embodiment of the inventive concept.
Figure 9:
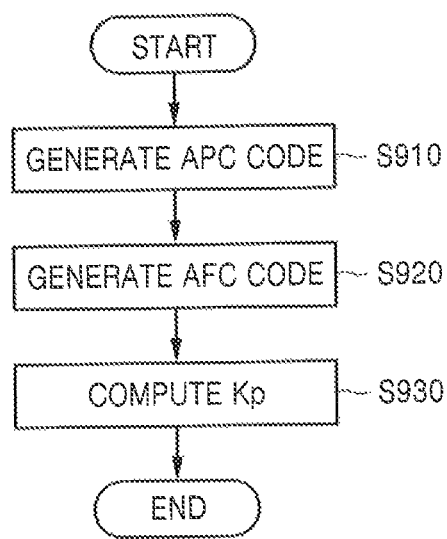
FIG. 9 is a flowchart of an operation of acquiring a frequency in the method illustrated in FIG. 8, according an exemplary embodiment of the inventive concept.
Figure 10:
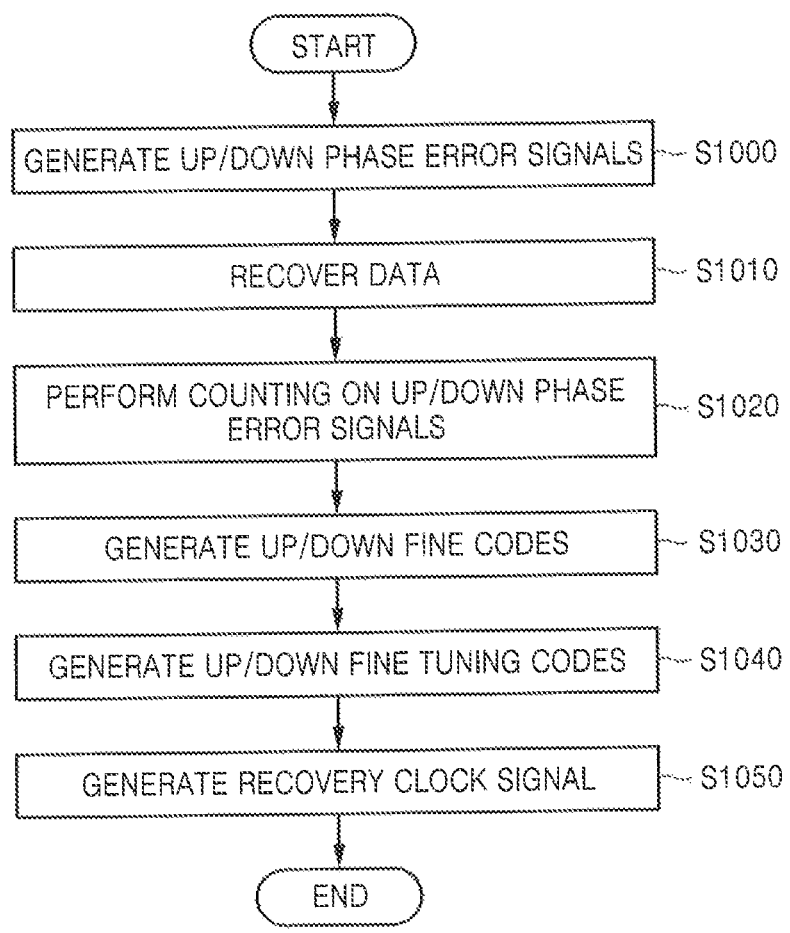
FIG. 10 is a flowchart of an operation of tracking a phase in the method illustrated in FIG. 8, according an exemplary embodiment of the inventive concept.

FIG. 8 is a flowchart of a method of operating the CDR circuit 10 illustrated in FIG. 2 according to an exemplary embodiment of the inventive concept. FIG. 9 is a flowchart of an operation of acquiring a frequency in the method illustrated in FIG. 8, according to an exemplary embodiment of the inventive concept. FIG. 10 is a flowchart of an operation of tracking a phase in the method illustrated in FIG. 8, according to an exemplary embodiment of the inventive concept.

Referring to FIGS. 1 through 10, the method may include acquiring a frequency using the DCO 20, the APC unit 30, and the AFC unit 35 in operation S800. In operation S800, the APC code APCC and the AFC code AFCC are generated to acquire a frequency. For example, the frequency of the recovery clock signal RCS. Operation S800 may include operations S910 through S930.

The APC unit 30 may generate the APC code APCC, which determines the source current $I_S$ for determining a frequency change per unit of the AFC code AFCC which changes the frequency of the recovery clock signal RCS, in operation S910. The finalized APC code APCC maintains the product of the first proportional constant $\alpha_{PVT}$ and the source current $I_S$ to be constant regardless of PVT changes, thereby regulating a frequency change per one bit of the AFC code AFCC, in other words, maintaining the frequency change to be constant.

The AFC unit 35 may compare the reference clock signal RFCS with the recovery clock signal RCS generated according to the finalized APC code APCC, determine the AFC code AFCC and the initial up/down fine tuning codes $IFTC_{UP}$ and $IFTC_{DN}$, and control the DCO 20 to make the frequency of the recovery clock signal RCS close to the target frequency in operation S920. The AFC unit 35 may compare a frequency change of the AFC code AFCC with a frequency change of the up/down fine tuning codes $FTC_{UP}$ and $FTC_{DN}$ to compute the target proportional path gain $K_P$ in operation S930. The finalized proportional path gain $K_P$ maintains the product of the second proportional constant $\Delta FI$ to be constant regardless of PVT changes, thereby regulating a frequency change per one bit of the up/down fine tuning codes $FTC_{UP}$ and $IFTC_{DN}$ to a target frequency change.

When the AFC unit 35 determines that the frequency of the recovery clock signal RCS is close to the target frequency, in other words, when the AFC unit 35 acquires a frequency for the recovery clock signal RCS; the AFC unit 35 may transmit the frequency lock signal LOCK to the DPD and DES 40.

The method may also include phase tracking performed using the DPD and DES 40, the counter 50, the N-divider 55, the bang-bang DLF 60, and the loop combiner 70 in operation S810. In the phase tracking operation S810, the phase of the recovery clock signal RCS is made close to the phase of the serial data SD based on the up/down fine tuning codes $FTC_{UP}$ and $FTC_{DN}$ generated by combining a proportional path and an integral path. Close to the phase of the serial data may mean as close as possible or very close to the phase of the serial data, for example. The phase tracking operation S810 may include operations S1000 through S1050 illustrated in FIG. 10.

Upon receiving the frequency lock signal LOCK, the DPD and DES 40 may detect a phase difference between the serial data SD and the recovery clock signal RCS and generate the up and down phase error signals $PES_{UP}$ and $PES_{DN}$ in operation S1000. The DPD and DES 40 may sample the serial data SD to output the recovered data RDATA in operation S1010. The counter 50 may detect and count edges of each of the up and down phase error signals $PES_{UP}$ and $PES_{DN}$ at a predetermined interval to generate the up and down phase error count signals $PES\_CNT_{UP}$ and $PES\_CNT_{DN}$ in operation S1020.

The N-divider 55 may divide the frequency of the recovery clock signal RCS by N according to the integral path gain N to generate the frequency-divided clock signal RCS_D. The bang-bang DLF 60 may generate the up and down fine codes $FC_{UP}$ and $FC_{DN}$ based on a result of comparing the up phase error count signal $PES\_CNT_{UP}$ with the down phase error count signal $PES\_CNT_{DN}$ and according to the integral path gain N and the proportional path gain $K_P$, which have been determined by the AFC unit 35, in operation S1030.

The loop combiner 70 may generate the up and down fine tuning codes $FTC_{UP}$ and $FTC_{DN}$, which change the frequency and phase of the recovery clock signal RCS, based on the up and down phase error signals $PES_{UP}$ and $PES_{DN}$ and the up and down fine codes $FC_{UP}$ and $FC_{DN}$ in operation S1040. The DCO 20 may generate the recovery clock signal RCS whose frequency and phase have been controlled by the up and down fine tuning codes $FTC_{UP}$ and $FTC_{DN}$ in operation S1050.

As described above, according to an exemplary embodiment of the inventive concept, a proportional path gain is regulated to a predetermined value regardless of PVT changes, so that a CDR circuit can be designed to have a target loop characteristic. In addition, the CDR circuit improves characteristics related with loop stability, loop latency of a proportional path, and resolution of an integral path, thereby reducing jitter.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A clock data recovery circuit, comprising:
   a digital phase detector and deserializer configured to sample serial data using a recovery clock signal to generate an up phase error signal and a down phase error signal which correspond to a phase difference between the serial data and the recovery clock signal;
   a digital loop filter configured to generate an up fine code and a down fine code based on a result of counting the up and down phase error signals;
   a loop combiner configured to generate an up fine tuning code and a down fine tuning code by using the up and down phase error signals and the up and down fine codes; and
   a digitally controlled oscillator configured to generate the recovery clock signal having a frequency changed with the up and down fine tuning codes.

2. The clock data recovery circuit of claim 1, further comprising:
   an automatic frequency control (AFC) unit configured to generate an AFC code which changes a frequency of the recovery clock signal; and
   an automatic process compensation (APC) unit configured to generate an APC code for regulating a frequency change per bit of the AFC code by controlling a source current.

3. The clock data recovery circuit of claim 2, wherein the AFC unit compares the frequency change of the AFC code with a frequency change of the up and down fine tuning codes and computes a proportional path gain keeping the frequency change of the up and down fine tuning codes constant.

4. The clock data recovery circuit of claim 2, wherein the digitally controlled oscillator comprises:
   a ring oscillator configured to generate the recovery clock signal;
   a source current generating unit configured to generate the source current according to the APC code;
   a copy current generating unit configured to generate a copy current which is supplied to the ring oscillator in units of the source current according to the AFC code; and
   a capacitance controlling unit connected to the ring oscillator and comprising load capacitors each having a capacitance varying with the up and down fine tuning codes.

5. The clock data recovery circuit of claim 2, wherein the digital phase detector and deserializer generates the up and down phase error signals after the frequency of the recovery clock signal is changed by the AFC code.

6. The clock data recovery circuit of claim 2, wherein the digital loop filter generates the up and down fine codes based on the result of the counting of the up and down phase error signals according to a frequency-divided clock signal resulting from dividing the frequency of the recovery clock signal by N, wherein N is a positive non-zero integer and is generated by the AFC unit.

7. The clock data recovery circuit of claim 1, wherein the up fine code comprises an integral up fine code and an additional up fine code resulting from adding a proportional path gain to the integral up fine code and the down fine code comprises an integral down fine code and an additional down fine code resulting from subtracting the proportional path gain from the integral down fine code.

8. A semiconductor device, comprising:
   an input/output interface comprising the clock data recovery circuit of claim 1; and
   a data processing circuit configured to process the serial data based on the recovery clock signal.

9. A method of operating a clock data recovery circuit, the method comprising:
   generating an automatic process compensation (APC) code, which regulates a frequency change per bit of an automatic frequency control (AFC) code;
   generating the AFC code which enables a frequency of a recovery clock signal to approach a target frequency; and
   performing a phase tracking to make a phase of the recovery clock signal approach a phase of serial data based on an up fine tuning code and a down fine tuning code.

10. The method of claim 9, wherein the APC code determines a source current for determining the frequency change per bit of the AFC code and the method further comprises:
   comparing a frequency change of the AFC code with a frequency change of the up and down fine tuning codes and computing a proportional path gain keeping the frequency change of the up and down fine tuning codes constant.

11. The method of claim 9, wherein the performing of the phase tracking comprises:
   detecting a phase difference between the serial data and the recovery clock signal and generating an up phase error signal and a down phase error signal;
   generating recovered data by sampling the serial data to form parallel data;
   generating an up phase error count signal and a down phase error count signal by counting the up and down phase error signals;
   generating an up fine code and a down fine code using an integral path gain and a proportional path gain based on a result of comparing the up phase error count signal with the down phase error count signal;
   generating the up fine tuning code and the down fine tuning code, which change the frequency and phase of the recovery clock signal, based on the up and down phase error signals and the up and down fine codes; and
   generating the recovery clock signal whose frequency and phase are controlled by the up and down fine tuning codes.

12. The method of claim 11, wherein the generating of the up and down phase error signals is performed after the AFC and APC codes are generated.

13. The method of claim 11, wherein the generating of the up and down fine codes comprises generating the up and down fine codes based on the result of the counting of the up and down phase error signals according to a frequency-divided clock signal resulting from dividing the frequency of the recovery clock signal by N, N is a positive non-zero integer.

14. The method of claim 11, wherein the up fine code comprises an integral up fine code and an additional up fine code resulting from adding the proportional path gain to the integral up fine code and the down fine code comprises an integral down fine code and an additional down fine code resulting from subtracting the proportional path gain from the integral down fine code.

15. A clock data recovery circuit, comprising:
- an automatic process compensation (APC) circuit configured to generate an APC code;
- an automatic frequency control (AFC) circuit configured to generate an AFC code, a proportional path gain and an integral path gain;
- a digital loop filter configured to generate up and down fine codes by using an up phase error count signal and a down phase error count signal according to the integral path gain and the proportional path gain;
- a loop combiner configured to generate up and down fine tuning codes based on up and down phase error signals and the up and down fine codes; and
- a digitally controlled oscillator configured to generate a recovery clock signal whose frequency is controlled by the APC code, the AFC code, and the up and down fine tuning codes.

16. The clock data recovery circuit of claim 15, wherein the APC code is generated by comparing the recovery clock signal to a reference clock signal.

17. The clock data recovery circuit of claim 16, wherein the APC code determines a source current which determines a unit of change of the AFC code.

18. The clock data recovery circuit of claim 15, further comprising a digital phase detector and deserializer configured to generate the up and down phase error signals from serial data.

19. The clock data recovery circuit of claim 15, wherein the AFC circuit changes the proportional path gain when there is a change in the up and down fine tuning codes.

* * * * *